(12) United States Patent
Yan (10) Patent No.: US 7,059,868 B1
(45) Date of Patent: Jun. 13, 2006

(54) CONNECTION OF TRACE CIRCUITRY IN A COMPUTER DISK DRIVE SYSTEM

(75) Inventor: Yan Yan, Fremont, CA (US)

(73) Assignee: Western Digital (Fremont), Inc., Lake Forest, CA (US)

( * ) Notice: Subject to any disclaimer, the term of this patent is extended or adjusted under 35 U.S.C. 154(b) by 154 days.

(21) Appl. No.: 10/378,268

(22) Filed: Mar. 3, 2003

Related U.S. Application Data (63) Continuation of application No. 09/519,280, filed on Mar. 7, 2000, now abandoned.

(51) Int. Cl.
*H01R 12/00* (2006.01)

(52) U.S. Cl. ...................................... 439/67; 360/245.9

(58) Field of Classification Search ................ 439/67, 439/77; 360/264.2, 245.9
See application file for complete search history.

(56) References Cited

U.S. PATENT DOCUMENTS

| | | | |
|---|---|---|---|
| 4,116,517 A * | 9/1978 | Selvin et al. ................. | 439/67 |
| 4,121,044 A | 10/1978 | Hadersbeck et al. | |
| 4,761,699 A | 8/1988 | Ainslie et al. | |
| 5,014,145 A | 5/1991 | Hosokawa et al. | |
| 5,055,969 A | 10/1991 | Putnam | |
| 5,095,396 A | 3/1992 | Putnam et al. | |
| 5,103,359 A | 4/1992 | Marazzo | |
| 5,121,273 A | 6/1992 | Slezak | |
| 5,130,895 A | 7/1992 | Somemiya et al. | |
| 5,140,482 A | 8/1992 | Kimura et al. | |
| 5,161,074 A | 11/1992 | Forbord et al. | |
| 5,202,804 A | 4/1993 | Takekado | |
| 5,213,511 A * | 5/1993 | Sobhani ........................ | 439/67 |
| 5,215,471 A * | 6/1993 | Reymond et al. ............. | 439/66 |
| 5,242,314 A | 9/1993 | Di Giulio et al. | |
| 5,245,489 A | 9/1993 | Kimura et al. | |
| 5,270,997 A | 12/1993 | Katayama | |
| 5,325,252 A | 6/1994 | Yagi et al. | |
| 5,337,202 A | 8/1994 | Jabbarai et al. | |
| 5,354,205 A * | 10/1994 | Feigenbaum et al. ......... | 439/67 |
| 5,415,555 A * | 5/1995 | Sobhani ........................ | 439/74 |
| 5,422,764 A | 6/1995 | McIlvanie | |
| 5,491,597 A | 2/1996 | Bennin et al. | |
| 5,499,924 A * | 3/1996 | Arisaka et al. ................ | 439/67 |
| 5,526,208 A | 6/1996 | Hatch et al. | |
| 5,530,604 A | 6/1996 | Pattanaik | |
| 5,532,889 A | 7/1996 | Stefansky et al. | |
| 5,533,904 A * | 7/1996 | Nobel et al. ................... | 439/67 |
| 5,550,694 A | 8/1996 | Hyde | |
| 5,615,068 A | 3/1997 | Matsuda et al. | |
| 5,631,786 A | 5/1997 | Erpelding | |
| 5,631,788 A | 5/1997 | Richards | |
| 5,644,452 A | 7/1997 | Cox et al. | |
| 5,644,454 A | 7/1997 | Arya et al. | |
| 5,655,285 A | 8/1997 | Bonn et al. | |
| 5,662,896 A | 9/1997 | Barber et al. | |
| 5,668,684 A | 9/1997 | Palmer et al. | |
| 5,680,274 A | 10/1997 | Palmer | |
| 5,680,277 A | 10/1997 | Bonn et al. | |

(Continued)

*Primary Examiner*—Neil Abrams (57) ABSTRACT

A system and method for connecting flexible circuitry in a disk drive system such as that used in computer systems. The system and method allow a large number of traces to be connected in a small area by forming male and female connector portions at an end of a mating pair of traces. the male and female portions are formed using conventional flexible circuit fabrication techniques, making possible very accurate control of very small built-in type connectors. The connection can be uncoupled and re-coupled, and added security of attachment can be achieved through the use of ultra-sonic bonding and use of a mechanical clamp.

11 Claims, 9 Drawing Sheets

U.S. PATENT DOCUMENTS

| | | |
|---|---|---|
| 5,685,734 A | 11/1997 | Kutz |
| 5,708,541 A | 1/1998 | Erpelding |
| 5,717,541 A | 2/1998 | Ycas et al. |
| 5,739,982 A | 4/1998 | Arya et al. |
| 5,754,368 A | 5/1998 | Shiraishi et al. |
| 5,754,369 A | 5/1998 | Balakrishnan |
| 5,757,585 A | 5/1998 | Aoyagi et al. |
| 5,776,706 A | 7/1998 | Siiman et al. |
| 5,781,380 A | 7/1998 | Berding et al. |
| 5,835,306 A | 11/1998 | Bennin |
| 5,844,751 A | 12/1998 | Bennin et al. |
| 5,844,753 A | 12/1998 | Inaba |
| 5,859,746 A | 1/1999 | Ishida et al. |
| 5,862,014 A | 1/1999 | Nute |
| 5,870,253 A | 2/1999 | Ogawa et al. |
| 5,876,216 A | 3/1999 | Schadewald, Jr. et al. |
| 5,883,759 A | 3/1999 | Schulz |
| 5,889,636 A | 3/1999 | Arya et al. |
| 5,894,458 A | 4/1999 | Takizawa et al. |
| 5,938,455 A * | 8/1999 | Glovatsky et al. ............ 439/74 |
| 5,961,334 A * | 10/1999 | Inaba .......................... 439/67 |
| 5,996,623 A | 12/1999 | Omberg |
| 6,025,988 A * | 2/2000 | Yan ............................ 361/685 |
| 6,118,080 A | 9/2000 | Jiang et al. |

* cited by examiner

CONNECTION OF TRACE CIRCUITRY IN A COMPUTER DISK DRIVE SYSTEM

This application is a Continuation of U.S. patent application Ser. No. 09/519,280, Filed Mar. 7, 2000, abandoned.

BACKGROUND OF THE INVENTION

Field of the Invention

The present invention relates to magnetic disk drive storage systems and more particularly to connection of circuitry therein.

Figure 1A:
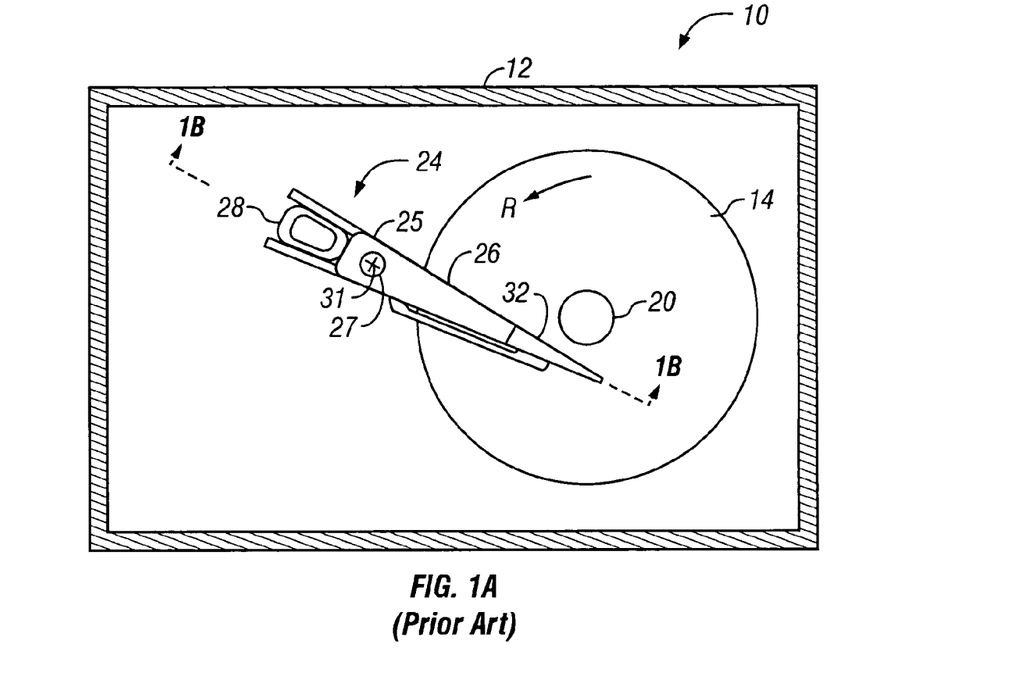
FIG. 1A is a top plan view of a hard disk drive system 1A.
Figure 1B:
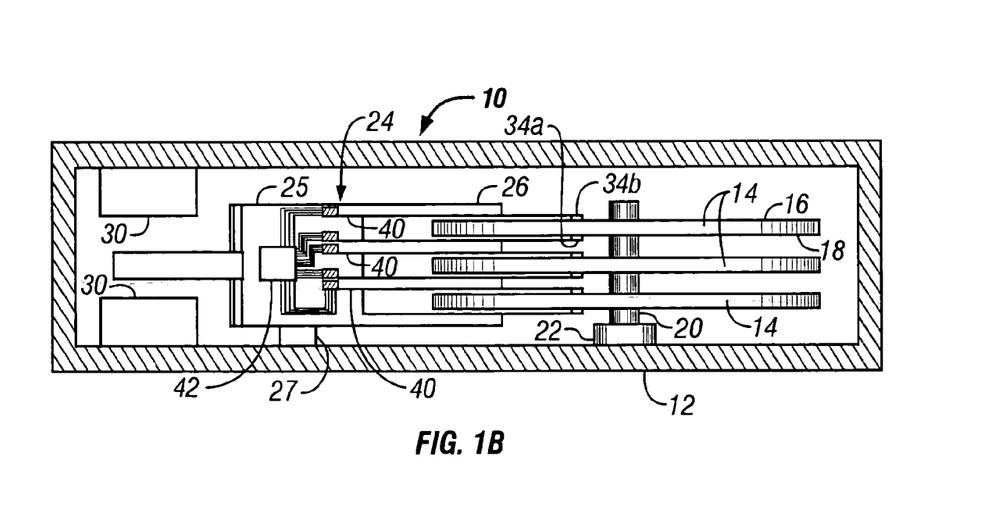
FIG. 1B is a cross-sectional front elevation view taken along line 1B—1B of FIG. 1A.

Magnetic disk drives are used to store and retrieve data for digital electronic apparatuses such as computers. In FIGS. 1A and 1B, a magnetic disk data storage system 10 of the art is illustrated which includes a sealed enclosure 12 and a plurality of magnetic disks 14, each of which has an upper surface 16 and a lower surface 18. The disks are supported for rotation by a spindle 20 of a motor 22.

An actuator 24 includes an E-block 25 having at its distal end a plurality of actuator arms 26. The actuator also includes a bearing 27, which mounts the actuator 24 pivotally within the enclosure 12, and further includes a voice coil 28 at its proximal end. The voice coil is disposed between a pair of magnets 30 which are fixedly connected with respect to the enclosure 12. Generating an electrical current in the coil 28 induces a magnetic field about the coil. Interaction between the magnetic fields of the coil 28 and the magnets 30 provides a desired, controlled pivotal movement of the actuator about a pivot point 31 of the bearing 27.

With continued reference to FIGS. 1A and 1B, the actuator arms 26 support a plurality of suspensions 32, each of which supports at its distal end a slider 34a, 34b. Each suspension holds its corresponding slider 34a, 34b in close proximity to a surface of one of the disks 14 to facilitate reading and recording data to and from the disk 14.

The motor 22 and spindle 20 cause the disks 14 to rotate. As the disks 14 rotate, the air immediately adjacent the disks moves with the disks as a result of friction and the viscosity of the air. This moving air passes between each of the sliders 34b, 34a and its adjacent disk surface 16, 18 forming an air bearing. This air bearing causes the head to fly a very small distance from the disk surface 16, 18.

Each of the sliders 34b, 34a has embedded within it a read element and a write element (both not shown). As the disk surface 16 or 18 moves past the slider 34b, 34a the write element generates a magnetic field leaving magnetic data on the passing disk 14. Such write elements are generally in the form of an electrical coil passing through a magnetic yoke. As a current passes through the coil it induces a magnetic field which in turn generates a magnetic flux in the yoke. A gap in the yoke causes the magnetic flux in the yoke to generate a magnetic field which fringes out from the gap. Since the gap is purposely located adjacent the disk, this magnetic fringing field imparts magnetic data onto the passing magnetic disk 14. The coil is embedded within a dielectric material which electrically isolates it from the yoke. An insulating layer covers the write element.

The read element detects changes in surrounding magnetic fields caused by the disk 14 passing thereby. Several read elements may be used to read such data. An effective read element currently in use is a GMR Spin Valve sensor. Such sensors take advantage of the changing electrical resistance exhibited by some materials when a passing magnetic field affects the magnetic orientation of adjacent magnetic layers. At its most basic level, a GMR spin valve includes a free magnetic layer and a pinned magnetic layer separated by a non-magnetic layer such as copper. The pinned layer has magnetization which is pinned in a pre-selected direction. On the other hand, the free layer has a direction of magnetization which is perpendicular with the pinned layer, but is free to move under the influence of an external magnetic field such as that imparted by a passing magnetic recording medium. As the angle between the magnetic directions of the free and pinned layers changes, the electrical resistance through the sensor changes as well. By sensing this change in electrical resistance, the magnetic signal passing by the read element can be detected. The read sensor is embedded within a dielectric layer, between a shield and the yoke of the write element.

Figure 2:
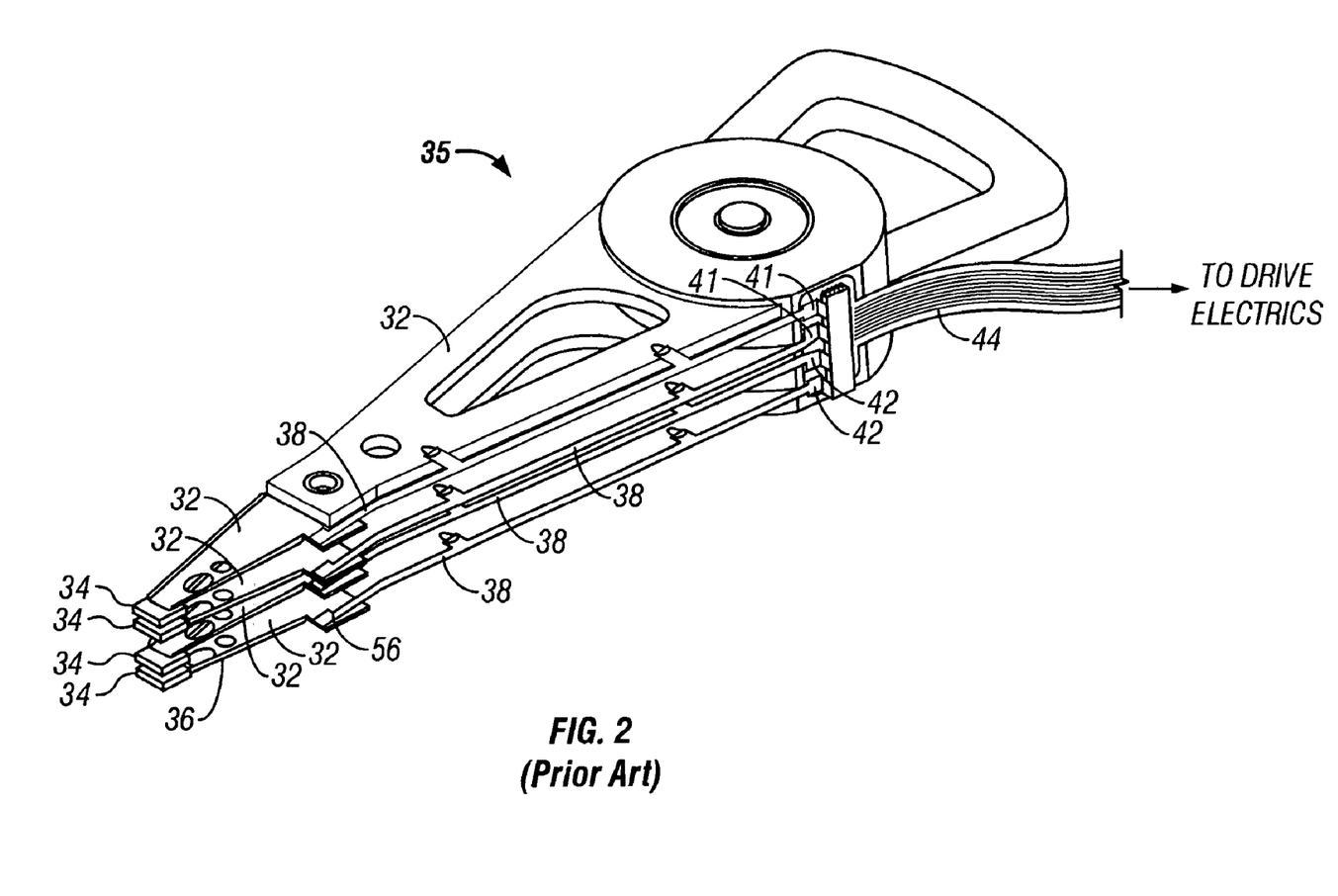
FIG. 2 is a perspective view of a head suspension assembly (HSA) of the prior art.

With reference now to FIG. 2, a head suspension assembly (HSA) 35 is illustrated. Read and write signals from the heads 34 pass through trace circuitry 36 on the suspension 32 to a flexible interconnect adapter (FIA) 38. The FIA 38 has its own set of trace circuitry 40 (FIG. 3A) for conducting the read and write signals to a junction 42 on the E-block 25. From the junction 42, the signals are routed through flexible circuitry 44 to a mother chip (not shown).

Figure 3A:
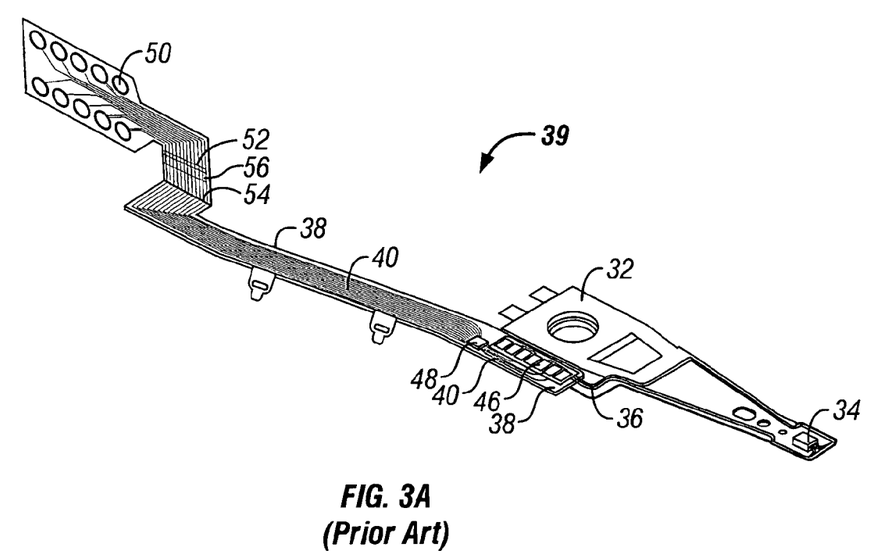
FIG. 3A is a perspective view of a head gimbal assembly (HGA) of the prior art.

With reference to FIG. 3A a head gimbal assembly (HGA) 39 is illustrated. The HGA 39 includes the suspension 32 having a head 34 and FIA 38 attached thereto. Connection of the suspension trace circuitry 36 and the FIA trace circuitry 40 is made at the location of a set of suspension contacts 46. Connection can be accomplished either by solder reflow techniques or by ultrasonic bonding. The read and write signals pass through a split pre-amp 48 on the FIA 38.

The a real density (bits per unit area of storage surface) of magnetic hard disk drives has been increasing significantly. These increases have been achieved by a combination of increased track density—which is the number of tracks per inch along the radius of the disk—and an increase in linear bit density—which is the number of bits written along one inch of a track. As the storage industry progresses toward increasing the areal density, or the memory capacity, the increase in linear density and data transfer rate is a consequential by-product of the trend. The higher data rates will force up the bandwidth required for transmitting read and write signals between the read/write transducer and the front-end electronics module. The maximum attainable data rate of a magnetic data storage device depends on the components in the recording channel, e.g. electronics, interconnects, head and media. The suspension interconnect becomes less of a limitation as its length is made shorter. This can be accomplished by placing a Read/Write IC or pre-amp 48 as close as practicable to the head 34. This split preamplifier architecture splits the standard read/write chip mounted on a head stack assembly (HSA) into two or more pieces, including a mother chip and a series of daughter chips mounted on the head gimbal assembly (HGA).

As memory capacity and data transfer rates of hard disk drives increase, the signal-to-noise ratios become more critical. One way to improve the signal to noise ratio is to amplify the signal from the head. U.S. Pat. No. 5,055,969 issued to Patnam, for example, discloses an amplifier on the actuator arm of a disk drive. Placement of this amplifier on the actuator arm, close to the head improves the signal to noise ratio before the signal is overwhelmed by noise.

With continued reference to FIG. 3A, the FIA 38 includes a set of test contacts 50. The test contacts are used to connect with test equipment (not shown) to test the performance of the HGA 39 prior to installation onto the E-block 25. After the performance of the HGA 39 has been confirmed, the FIA 38 is cut along line 52, removing the test contacts 50. The FIA 38 is also bent at 90 degrees along line 54 to allow a set of FIA contacts 56 to join with a similar set of contacts on the E-block 25. Connection between the FIA contacts 56 and the contacts of the E-block 25 can be made by solder reflow techniques or by ultrasonic bonding.

Figure 3B:
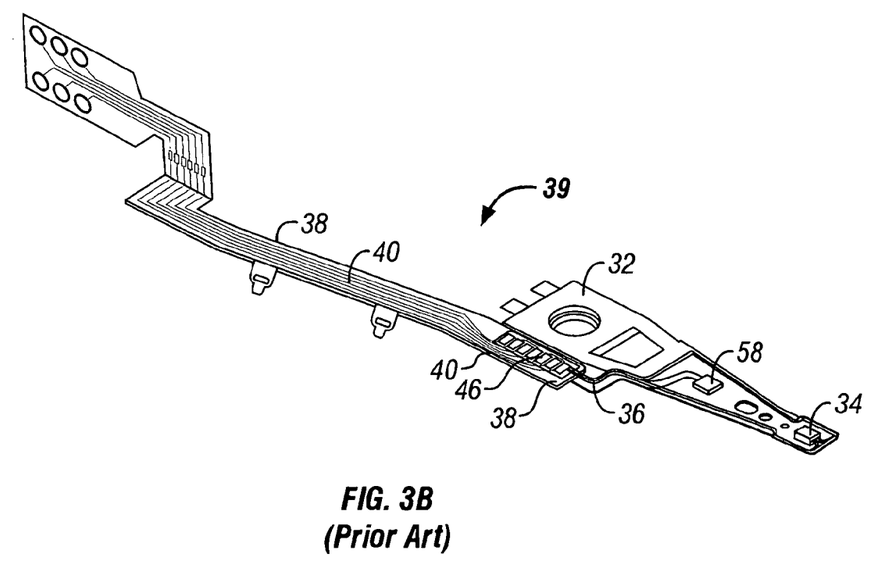
FIG. 3B is a view similar to that of FIG. 3B of a (HGA) of the prior art having a micro-actuator.

With reference to FIG. 3B, another way of achieving such higher density has been to record data in much narrower tracks. A very high precision servo would be required to drive the slider and position it over such a narrow data track. One promising approach is a dual-stage servo system, which uses the conventional voice coil motor as a primary (coarse low-bandwidth) actuator, and the piezoelectric micro-actuator 58 as a secondary (fine high-bandwidth) stage. The micro-actuator 58 flexes the suspension slightly laterally, thereby finely adjusting the location of the head 34 in relation to the disk 14 (not shown in FIG. 3B).

With reference to FIG. 3B, the use of such a micro-actuator 58 in conjunction with a pre-amp 48 has been limited by the number of traces necessary to accommodate such a combination. Such a combination would necessitate multiple traces leading from the pre-amp to the E-block 25. The problem arises, not in fitting the trace lines 40 on the FIA 38, but in connecting the FIA trace circuitry 40 with the circuitry 44 at the junction 42 located on the E-block 25 (FIG. 2). The conventional connection techniques, solder reflow and ultra-sonic bonding, are limited by space restrictions. Solder reflow is problematic because in small spaces the solder flows across contacts causing undesirable electric conduction between them. Ultrasonic bonding is similarly limited by the inability to develop equipment which can efficiently bond individual contacts in a very small area. In addition, the use of mechanical connections, such as conventional machined pin-and-socket connections is limited by the fact that such connectors cannot currently be manufactured with a pitch less than 0.05 inches.

Therefore, there remains a need for a connection technique which will allow a first set of trace circuitry, such as on a FIA 38 to be connected with a second set of trace circuitry, such as on an E-block 25 in an extremely small area. Such a connection technique would greatly facilitate the use of a pre-amp 48 in conjunction with micro-actuator 58, by accommodating connection of an increased number of traces. Such a technique would preferably allow for a connection which can be disconnected and re-connected while reducing wiring errors, increasing impedance control and signal quality and would reduce manufacturing cost by simplifying circuitry.

SUMMARY OF THE INVENTION

The present invention provides a system and method for connecting trace circuitry in a very small area. Using a photolithographic process familiar to those skilled in the art, a female connector is formed on one end of a first circuit. This is accomplished by first constructing a thick trace line and then selectively etching the trace to form the female connector. The finished copper is thick at interconnect areas and thinner at trace, or flexible, areas. Similarly, a male connector portion is formed at the end of a second trace circuit. Again, the trace line is formed thick and is etched to form the male connector portion and to render the trace line thin and flexible. The male and female connector portions are configured to be force fit one within the other.

The present invention allows many connections to be made in a very small area while reducing wiring errors and increasing impedance control and signal quality. The present invention also allows for circuit simplification and higher circuit density while reducing manufacturing cost.

The present invention facilitates testing and enhances the assembly process by allowing multiple reworks at the levels of the HGA and HSA. Another benefit of the present invention is that the FIA is readily removable and replaceable to enable rework of HGA and its defective components during the assembly process. Rework may be necessary several times for any of a number of reasons. For example, removing the HGA from a HSA is required to precisely align the heads, assure targeted static attitude and gram load, scrap the electrically defective heads and replace mechanical defective components. Accordingly, the FIA is re-usable a number of times to enable multiple reworks.

The system includes an actuator having one or more arms mounted for pivotal movement within an enclosure. Each arm has at its distal end a suspension which holds a magnetic head in close proximity to a surface of a rotating magnetic disk. As the disk turns, the head flies above the disk writing and reading data to and from the disk.

Trace circuitry routes data signals from the head to a set of contact pads on an edge of the suspension. A flexible interconnect adapter picks up the signals and routes them through trace circuitry on the flexible interconnect adapter to a junction located on the E-block. At that junction, the traces of the flexible interconnect adapter connect with trace circuitry on the E-block which routes the signals to a mother chip. A pre-amp is provided on the FIA, and a micro-actuator is provided on the suspension.

In order to handle the increased number of leads necessary to accommodate the pre-amp and micro-actuator, a set of mechanical connectors is used in the junction at the E-block to join the FIA trace circuitry with the trace circuitry of the E-block. The mechanical connectors achieve a male/female connection which advantageously allows connection in a much smaller area than is possible with prior art ultrasonic bonding and soldering techniques. In addition, the connectors are constructed using a semiconductor patterning process, advantageously allowing them to be constructed much smaller than is possible using existing machining techniques.

The patterning process for constructing the connectors includes lithography and etching. The trace circuitry of the FIA is formed relatively thick. The trace circuitry is then etched resulting in a thin trace circuit having a doughnut shaped raised portion at its end. After etching, a cover film is applied and exposed copper traces and raised portion are gold plated. The doughnut shaped raised portion has an inner socket of a predetermined inner dimension.

Similarly a male connector portion is formed on the end of the E-block trace circuitry. The trace is formed to be relatively thick, and is then etched to form the male portion which rises from the trace circuitry, having such a diameter that the male portion fits within the socket of the female portion in a force fit relationship.

It will be appreciated that the choice of which trace circuitry terminates in a male end and which should terminate in a female end is somewhat arbitrary. For example the circuitry of the E-block could be formed to have the female end, with the FIA trace circuitry having the male end. Furthermore the shape of the male portion and the socket can also be varied, so long as they connect together. These and other advantages of the present invention will become apparent to those skilled in the art upon a reading of the following descriptions of the invention and a study of the several figures of the drawings.

BRIEF DESCRIPTION OF THE DRAWINGS

The present invention will be readily understood by the following detailed description in conjunction with the accompanying drawings, with like reference numerals designating like elements of the background art.

DETAILED DESCRIPTION OF THE PREFERRED EMBODIMENTS

With reference to FIGS. 1A and 1B, the present invention is embodied in a system 10 for reading and recording data and for use with a computer system or the like. The system 10, contained within an enclosure 12, includes a spindle 20 driven by a motor 22. The spindle 20 supports one or more magnetic disks 14 for rotation within the enclosure 12. The disks have upper and lower surfaces 16, 18 on which data can be stored in the form of magnetic pulses.

An actuator 24, having one or more arms 26 extending from its distal end, is pivotally mounted upon a bearing 27 within the enclosure 12. The actuator 24 has at its proximal end a voice coil 28 which moves between a pair of magnets 30 fixedly connected with the enclosure 12. An electrical current in the coil 28 generates a magnetic field which interacts with a magnetic field of the magnets 24 to drive the actuator in a controlled manner.

A suspension 32 extends from each arm 26 of the actuator to suspend at its distal end a slider 34a, 34b. The suspension 32 holds the slider 34b, 34a close to a surface 16, 18 of a disk 14. As the disk 14 turns, air adjacent to the surface 16, 18 moves with the disk to flow under the slider 34b, 34a. This creates an air bearing under the slider, causing the slider to fly ever so slightly over the disk surface 16, 18. The slider has a read element and a write element (not shown) embedded therein which read and record magnetic signals to and from the passing disk surface 16, 18 and translate those signals into electrical signals.

Figures 4, 4A:
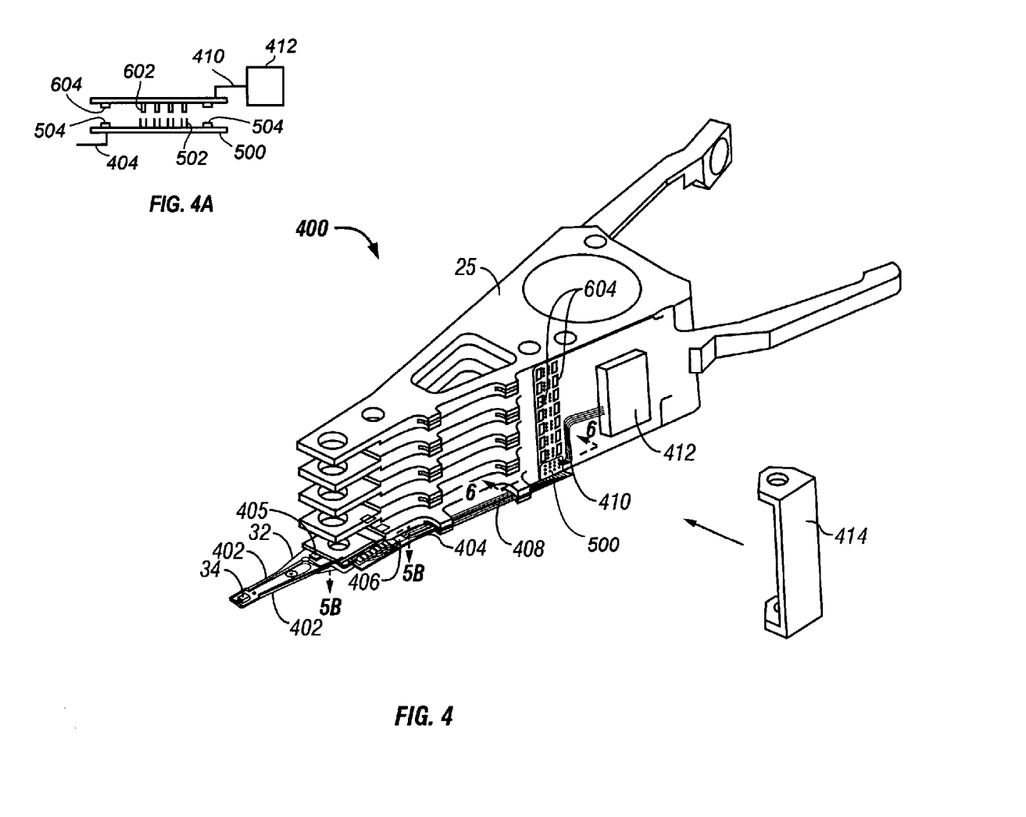
FIG. 4 is a perspective view of a HSA of the present invention.
FIG. 4A is a schematic diagram showing certain of the circuit parts of FIGS. 5A and 6 in juxtaposition.

FIG. 4 illustrates a head gimbal assembly (HGA) 400 according to an embodiment of the invention. The suspension 32 includes trace circuitry 402 which transmits the electrical signals from the slider 34 to a flexible interconnect adapter 404. The flexible interconnect adapter (FIA) 404 includes a pre-amp 406 which should be located as close as practicable to the slider 34. Trace circuitry 408 on the FIA transmits the electrical signals from the suspension 32 through the pre-amp 406 to a junction on the E-block 25. Trace circuitry 410 on the E-block 25 transmits the signals to a mother chip 412. A clamp 414 maintains connection between the FIA 404 and the E-block 25.

With continued reference to FIG. 4, the pre-amp 406 improves signal strength and reduces signal noise. In addition, the integration of a peizo-electric micro-actuator 405 improves bandwidth and positioning accuracy. As discussed above in reference to the Background of the Invention, such improvements greatly increase the number of trace circuits which must be routed from the pre-amp 406 to the mother chip 412. This large number of traces 408 translates to a correspondingly large number of connections between the FIA 404 and the trace circuitry 410 on the E-block 25.

With continued reference to FIG. 4, the pre-amp 406 improves signal strength and reduces signal noise. In addition, the integration of a peizo-electric micro-actuator improves bandwidth and positioning accuracy. As discussed above in reference to the Background of the Invention, such improvements greatly increase the number of trace circuits which must be routed from the pre-amp 406 to the mother chip 412. This large number of traces 408 translates to a correspondingly large number of connections between the FIA 404 and the trace circuitry 410 on the E-block 25.

Figure 5A:
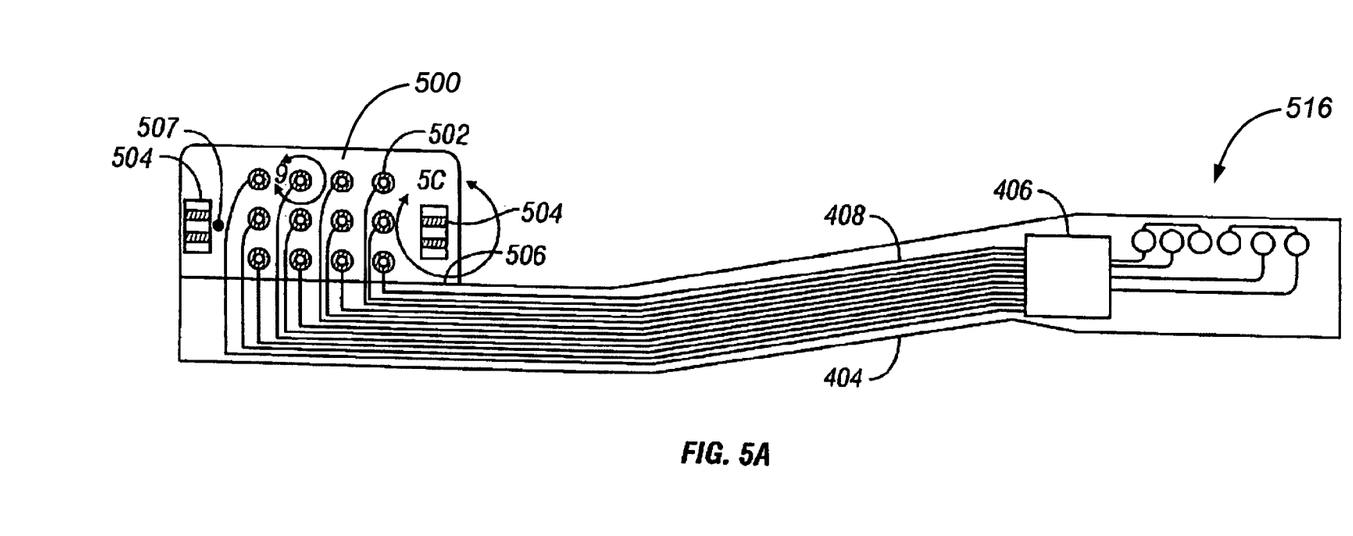
FIG. 5A is a plan view of a flexible interconnect adapter of the present invention.

With reference now to FIG. 5A, the FIA of the present invention can be more clearly understood. Each FIA trace 408 terminates in a doughnut shaped female connector portion 502 which is formed integrally with the trace 408, by a conductor patterning process which will be discussed further below. A pair of gold plated pads 504 are provided on the FIA 404 to help hold the FIA to the E-block 25 by welding the gold pads 504 with a matching set of pads 604 (FIG. 6) on the E-block 25. These pads 504 can be more clearly understood with reference to FIG. 5C as having gold plated copper tab portions 505 each surrounded by a window portion 509. An alignment hole 507 (FIG. 5A) mates with an alignment pad 605 (FIG. 6) on the E-block to ensure proper alignment of the FIA 404 on the circuitry 410 of the E-block 25. In order to attach the FIA 404 to the E-block 25, the FIA is bent at a bend line 506 to bring a part 500 of the FIA to an angle of 90 degrees.

Figure 5B:
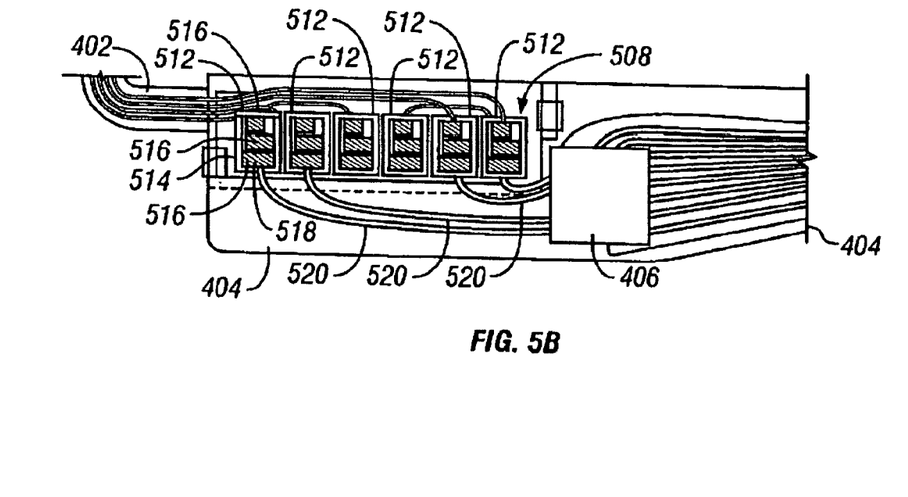
FIG. 5B is a view taken from line 5B—5B of FIG. 4.
Figure 5C:
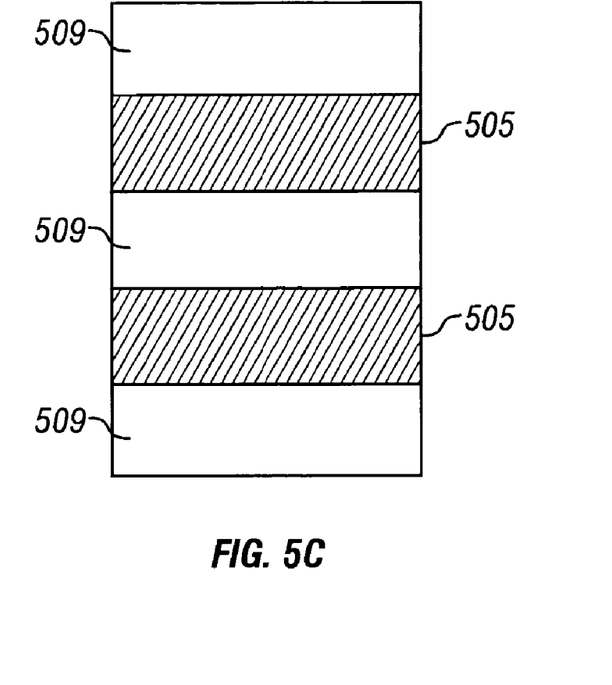
FIG. 5C is a view taken from the circle designated 5C in FIG. 5A, shown enlarged.

With reference now to FIG. 5B, a set of pads 508, located at the distal end of the FIA (indicated at 516 in FIG. 5A), for connecting the circuitry 402 of the suspension 32 will be described. These connectors are described in my co-pending application Ser. No. 09/213,472 entitled "INTERCONNECT ADAPTER AND HEAD SUSPENSION ASSEMBLY", which application is incorporated herein by reference in its entirety. FIG. 5B shows a pad set 508 coupled over a set of termination pads (not shown) of the suspension trace circuitry 402. One termination pad lies directly beneath each pad of the pad set 508. The placement of the pad set 508 can vary in configuration, as needed, according to the load beam geometry and amplifier chip 406 layout. According to one aspect of the invention, the pad set 508 includes six pads.

Each pad 512 includes a frame 514, and connection tabs 516. The frame 514 is rectangular in shape, having an inner periphery 518. The frame surrounds the connection tabs 516. The connection tabs 516 cantilever, extending from the inner periphery 518. Traces 520 couple the amplifier chip 406 to the frame 514 of each pad 512. Each frame 514 electronically couples with the tabs 516. The use of connection tabs 516 allows the pads 512 to be removed and replaced to facilitate reworks.

One tab 516 of each pad 512 ultrasonically bonds to the corresponding termination pads that underlie each pad 512. Each pad 512 disconnects from the corresponding termination pad when a laser, for example, is used to sever the tab 516 from the frame. The suspension trace circuits 402 are reconnectable to the pad 512 by re-coupling one of the remaining tabs 516 to one of the termination pads.

Figure 6:
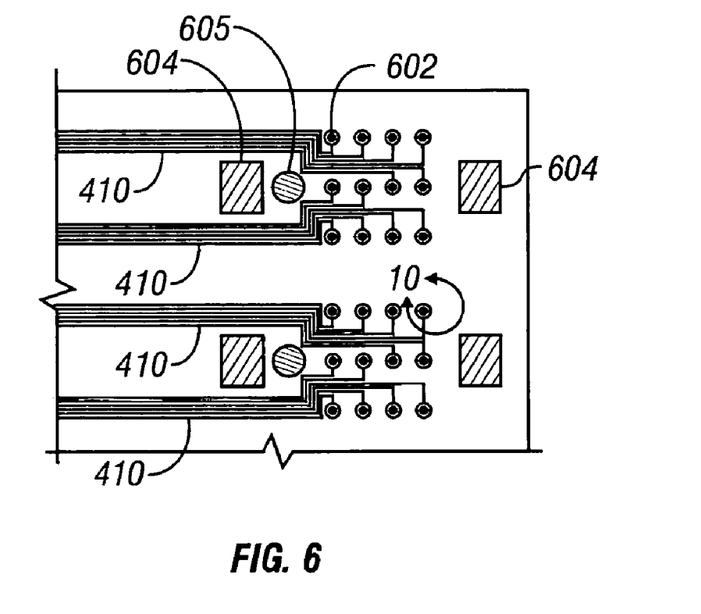
FIG. 6 is a view taken from line 6—6 of FIG. 4, shown enlarged.

With reference now to FIG. 6 the doughnut shaped female connectors 502 (FIG. 5A) of the FIA 404 are configured to receive a set of male connector portions or pins 602 in a force fit connection. The pins 602 are formed integrally with the trace circuitry 410 (FIG. 4). The male connector portions and trace circuitry are formed by lithography, and etching process in a similar manner to that used to produce the female connectors 502 and trace circuitry 408 of the FIA 404. A set of gold-plated pads 604 join with the pads 504 of the FIA 404 to hold the FIA to the E-block 25. The pads 604 and 504 are joined to at least one of the gold-plated copper tabs 505 by ultrasonic welding or the like.

Figure 7:
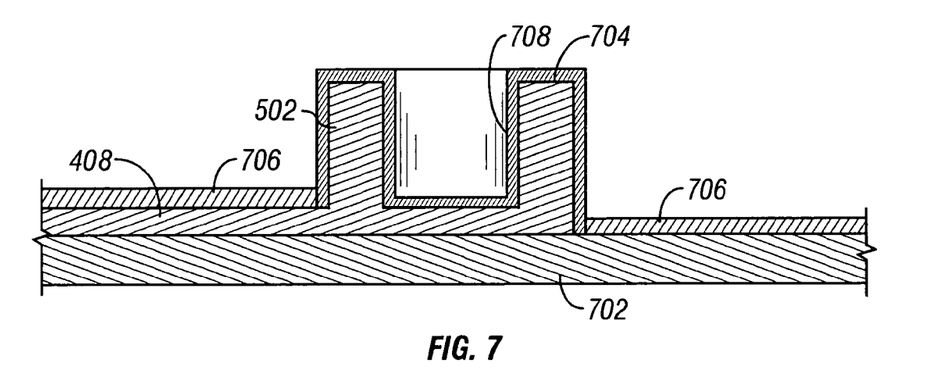
FIG. 7 is a view taken from line 7—7 of FIG. 9.

With reference to FIG. 7 the structure of the female connectors 502, can be more clearly understood. A layer of polyimide film provides a substrate 702 upon which the trace circuitry 408 and connector portion 502 are built. The trace circuitry 408 and female shaped connector 502 are formed of copper and are integral with one another. A layer of gold or nickel-gold (Ni—Au) alloy 704 coats the connector 502 to improve electrical conductivity and prevents corrosion of the connection with the male connector 602 (FIG. 6). A top dielectric layer 706 coats the trace circuitry 408 and substrate 702, with the connector 502 and its gold coating 704 extending therefrom. The female connector 502 and its gold coating 704 define a socket 708.

Figure 8:
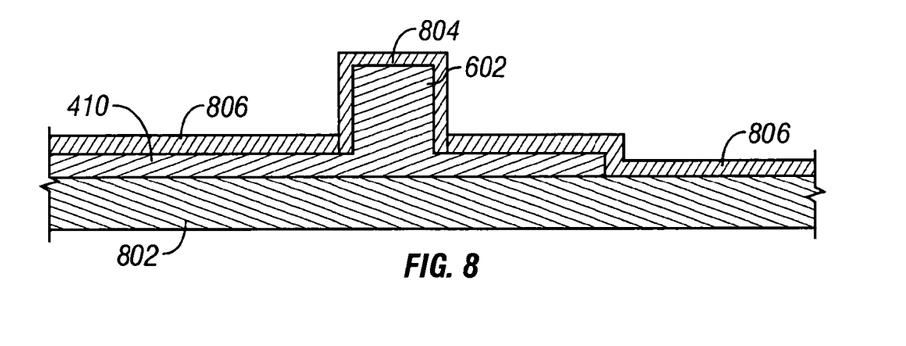
FIG. 8 is a view taken from line 8—8 of FIG. 10.

With reference to FIG. 8, the structure of the male connector portion 602 is similar to that described with reference to FIG. 7. A substrate 802 is constructed of a base layer of dielectric material. Upon the substrate the trace circuitry 410 and male connector 602 are integrally formed of copper. A layer of gold coats the male connector 602. A top dielectric layer 806 covers the substrate 802 and trace circuitry 410, the male connector portion 602 and its associated gold coating 804 extend from the insulation layer 806.

Figure 9:
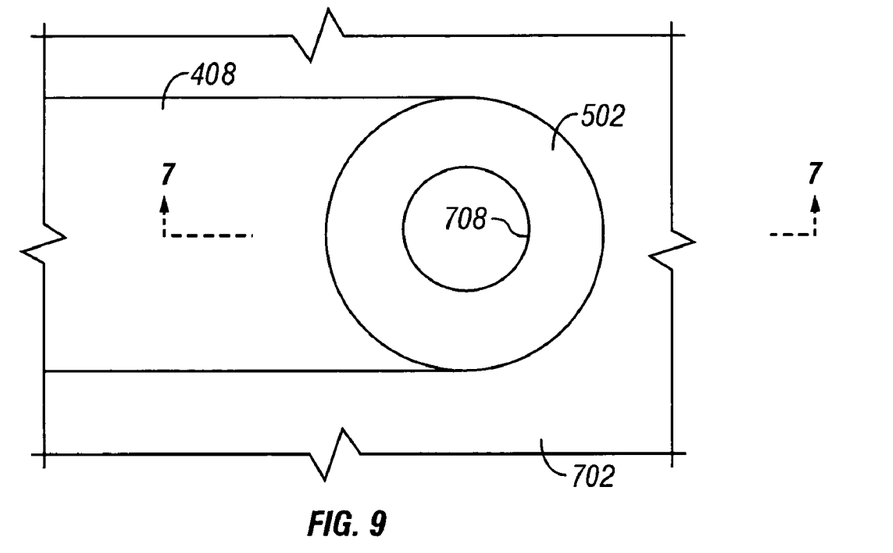
FIG. 9 is a view taken from the circle designated 9 in FIG. 5A shown enlarged and rotated 90 degrees clockwise.
Figure 10:
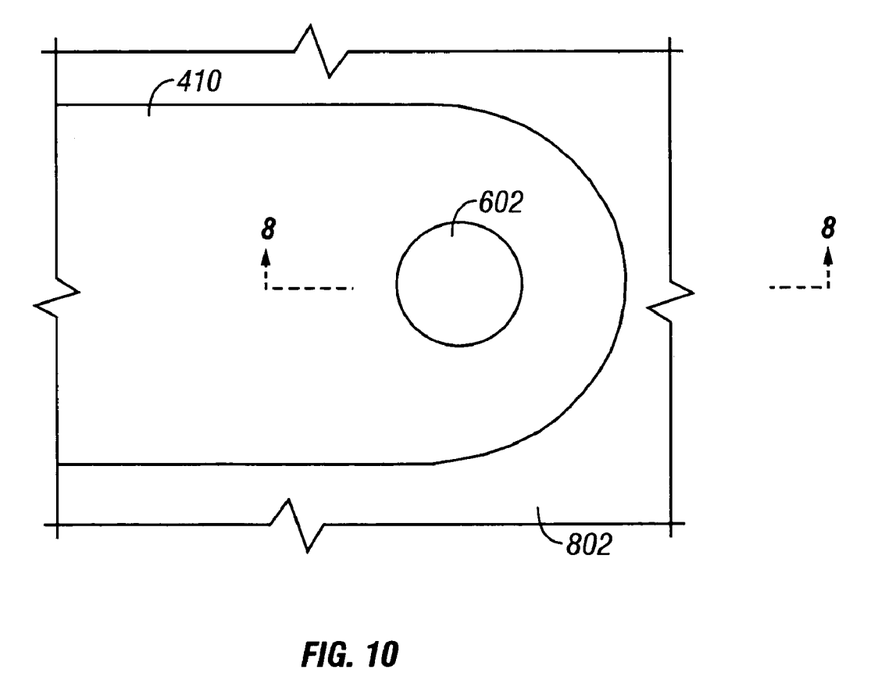
FIG. 10 is a view taken from the circle designated 10 in FIG. 6 shown enlarged and rotated 90 degrees clockwise.

With reference to FIG. 9, the female connector portion 502 of the preferred embodiment is shown with the top dielectric layer 706 removed. As can be seen, the socket 708 has a circular cross section. Similarly with reference to FIG. 10, also shown with the top dielectric 806 removed, the male connector portion 602 has a circular cross section. The male connector portion 602 defines a plug having a size and shape to allow the connector 602 to be force fit within the socket 708 of the female connector portion 502. The pitch (spacing) between adjacent male/female connectors preferably does not exceed about 0.015 inches and more preferably does not exceed about 0.010 inches. Also, the female connector portions preferably do not exceed 0.010 inches in outer diameter and more preferably do not exceed about 0.005 inches in outer diameter. Furthermore, the inner diameter of the female connector portion preferably does not exceed about 0.005 inches and more preferably does not exceed about 0.0025 inches. Similarly, the outer diameter of the male portion preferably does not exceed about 0.005 inches and more preferably about 0.0025 inches.

Figure 11:
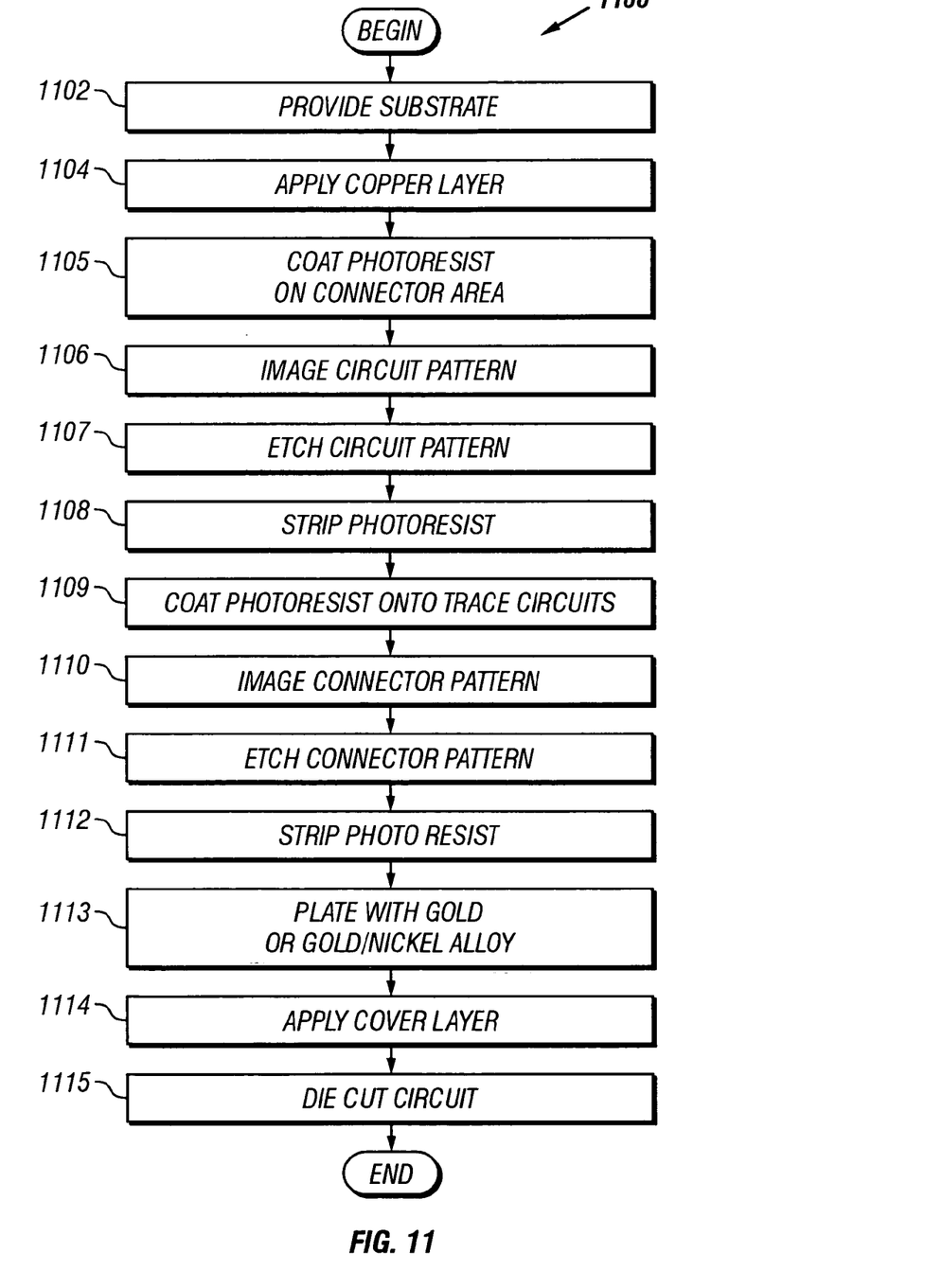
FIG. 11 is a diagram of a process of manufacturing the present invention.

With reference now to FIG. 11, a simplified fabrication process 1100 for constructing the trace circuitry 408, and connectors 502, of the present invention will be described. However, those skilled in the art will recognize that numerous manufacturing options and material choices are available to produce this specialized FIA connection. While the process will be described in terms of constructing the female connector 502 and trace circuitry 408 associated with the FIA 404, it should be appreciated that the same process can be used to construct the male connector 602 and trace circuitry 410 associated with the E-block 25. The process begins with a step 1102 of providing a substrate of polyimide base material. Then, in a step 1104, a layer of copper foil is added. The copper is applied thicker than would ordinarily be done for a conventional flex circuit. Then, in a step 1105, the copper is coated with a photoresist at the connector portion 502. In a step 1106, a photolithography process is used to image the circuit trace pattern on the copper layer. Thereafter, in a step 1107, the copper is etched to remove the copper which is not covered by the photoresist, thereby creating the traces. In a step, 1108, the photoresist is removed, and in a step 1109 a photoresist is coated onto the traces: Then, in a step 1110, the connector pattern is imaged using photolithography, and in a step 1111 the copper is etched again to form the connector 502 with its associated socket 708. In a step 1112, the photoresist is removed. The finished copper conductor has a different thickness at different places, being thin and flexible along the trace lines and thicker at the location of the connector. Thereafter, in a step 1113 the gold, or nickel/gold alloy, layer 704 is plated onto the connector 502. In a step 1114 the top dielectric layer (overlay) is applied such that the connector 502 extends uncovered therefrom. In a step 1115, the circuit is cut to form the FIA.

Once the FIA 404 has been constructed and the trace circuitry 410 and male connector 602 have been applied to the E-block 25, the head suspension assembly can be assembled in a manner familiar to those skilled in the art, with the FIA connected to the suspension 32. Connection between the FIA circuitry 408 and E-block circuitry 410 can be achieved by inserting the male connectors 602 into the female connectors 502. This can be accomplished simultaneously for all of the connectors of a single FIA 32, by aligning the connectors 502 of the FIA with the connectors 602 of the E-block 25 and then pressing the FIA against the E-block. To ensure contact, the pad sets 504 and 604 can be ultrasonically welded, however this is an optional step. Once all of the FIAs 32 have been attached to the E-block 25, the clamp 414 is fastened to the E-block to further ensure secure attachment of the FIAs 32 to the E-block 25.

From the above it can be appreciated that the present invention provides a solution to the problem of connecting a large number of circuits in a limited space. While the invention has been described herein in terms of a preferred embodiment, other embodiments of the invention, including alternatives, modifications, permutations and equivalents of the embodiments described herein, will be apparent to those skilled in the art from consideration of the specification, study of the drawings, and practice of the invention. For example, a virtually unlimited number of shapes are possible for the socket 708 of the female connector as well as for the male connector. For example the connectors could have a square cross section rather than a round one. In addition the female connector 704 could be located on the E-block 25 and the male connector 602 on the FIA 404. In addition, the fabrication process used to construct the invention could be altered.

The embodiments and preferred features described above should be considered exemplary, with the invention being defined by the appended claims, which therefore include all such alternatives, modifications, permutations and equivalents as fall within the true spirit and scope of the present invention.

What is claimed is:

1. A data recording and retrieval system, comprising:
   an enclosure housing therein a motor and a magnetic disk connected with and driven by said motor for rotation within said enclosure;
   an actuator, pivotally mounted within said enclosure;
   a suspension, connected with said actuator;
   a magnetic device embodied within a slider and capable of generating and receiving electrical signals, connected with an end of said suspension, said suspension holding said slider proximal to a surface of said disk;
   first circuitry conducting said electrical signals from said slider to a junction;
   second circuitry electrically coupled with said first circuitry at said junction;
   said junction including a shaped female connector portion integral with one of said first and second circuitry and having a socket formed therein, and a male connector portion integral with the other of said first and second circuitry said male portion configured for coupling with said socket of said female portion, said male and female connector portions being constructed by a patterning process, wherein said male and female connector portions mate in a force fit connection.

2. The data recording system of claim 1 wherein said male and female connector portions have a pitch no greater than 0.015 inches.

3. The data recording system of claim 1 wherein said male and female connector portions have a pitch no greater than 0.010 inches.

4. The data recording system of claim 1 wherein said female connector portion has an outer dimension no greater than 0.010 inches.

5. The data recording system of claim 1 wherein said female connector portion has an outer dimension no greater than 0.005 inches.

6. The data recording system of claim 1 wherein said socket of said female connector portion has a dimension no greater than 0.005 inches.

7. The data recording system of claim 1 wherein said socket of said female connector portion has a dimension no greater than 0.0025 inches.

8. The data recording system of claim 1 wherein said first circuitry is configured to bend at roughly a 90 degree angle.

9. The data recording system of claim 1, further comprising a micro-actuator.

10. The data recording system of claim 1, further comprising a clamp, securing said male and female portions together.

11. The data recording system of claim 1, further comprising an ultrasonic bond pad, securing said male and female portions together.

* * * * *